May 27, 1969 W. LIBEN 3,447,038
METHOD AND APPARATUS FOR INTERCONNECTING
MICROELECTRONIC CIRCUIT WAFERS
Filed Aug. 1, 1966

WILLIAM LIBEN
INVENTOR.

BY J. O. Tresansky
ATTORNEY

1

3,447,038

METHOD AND APPARATUS FOR INTERCONNECTING MICROELECTRONIC CIRCUIT WAFERS

William Liben, Silver Spring, Md., assignor to the United States of America as represented by the Secretary of the Navy Filed Aug. 1, 1966, Ser. No. 569,522
Int. Cl. H02b *1/04*
U.S. Cl. 317—101 4 Claims

ABSTRACT OF THE DISCLOSURE

The subject invention relates to the field of microelectronics and more particularly to microelectronic circuits and the method of their construction. In the instant invention, a rectangular substrate is provided with a grid of conductors mounted on one surface thereof. The grid consists of spaced conductors extending between parallel edges of the substrate, and other spaced conductors extending between the other parallel edges of the substrate, the conductors being insulated at their intersecting points. Microelectronic circuit wafers, each comprising components to form a desired circuit, are mounted on the substrate and are connected to the conductors of the grid by means of lands on said wafers and corresponding lands on said grid.

This invention relates generally to means for interconnecting electrical circuits and more particularly to a means for interconnecting microelectronic circuits and to a method of manufacture thereof.

A major problem in the manufacture of highly miniaturized electronic circuitry, also called microelectronic circuitry, has been the interconnection of the various elements or sub-circuits comprising the circuits. Because of the extremely small size of the components and the even smaller size of the electrical leads used with such components, the use of conventional wiring techniques is so inefficient as to be completely impractical.

Many techniques for printing, etching or depositing electrical interconnections are in general use. However, these techniques and the devices made by their use suffer disadvantages. In general, such devices have been very costly and difficult to manufacture. Also, the extremely small size required for use with microelectronic circuits has generally not been obtained. Still another fact relating to the high cost of prior art devices has been that each circuit configuration desired required a radically different technique of manufacture.

It is therefore an object of the present invention to provide a novel grid for interconnecting components, or circuits, of extremely small size compatible with microelectronic components.

Another object of this invention is to provide an interconnection grid of relatively simple and inexpensive manufacture.

A further object of this invention is to provide an electrical interconnection grid for microelectronic circuits which is light in weight, small in size, low in cost, and has high reliability.

Still another object of this invention is to provide a method of manufacture of an interconnection grid adapted to provide efficient mass production of the grid.

In accordnace with the present invention, microelectronic circuit wafers are provided wherein the conductors on each such circuit wafer terminate in lands which project above the plane of the circuit a substantial distance, e.g., ten to twenty microns. These lands may be deposited on the circuit wafers by the commonly utilized procedure of vacuum deposition. A system substrate is provided

2 which functions as a support for both the circuit wafers and for interconnecting wiring. This system substrate is made of a good insulating material having at least one flat surface. Suitable materials for said system substrate include both glass and ceramics. A matrix network of interconnecting metal conductors is deposited upon said system substrate and serves to interconnect all the microelectronic circuit wafers to form a complete system. This conductor network may be formed by evaporation in a vacuum through a mask, or by sputtering and subsequently removing all excess metal using photolithographic methods. Where it is necessary that conductors cross they may be insulated from each other by depositing an insulator between them at their crossing point. This matrix of conductive interconnections contains many terminations in the form of relatively thick lands which are formed in the same manner as said conductive interconnections. It should be noted that, while the conductors themselves may typically be one-quarter micron thick, said lands may typically be ten to twenty microns thick. For each set of lands on an individual microelectronic circuit wafer there is a corresponding set of lands on the system substrate.

Other objects and the attendant advantages of this invention will be better appreciated and said invention will become more clearly understood by reference to the following detailed description when considered in conjunction with the accompanying drawings illustrating one embodiment of the instant invention, wherein.

Figure 1:
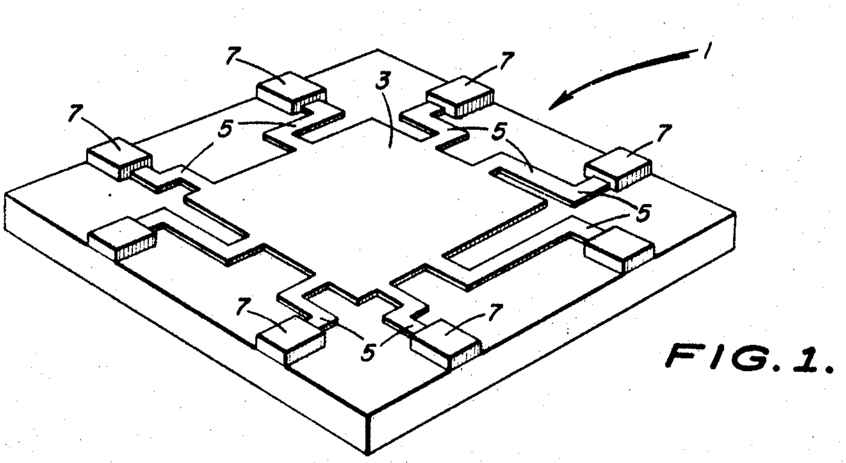
FIG. 1 is a perspective of a microelectroic circuit wafer.

Referring to the drawings in more detail, and more specifically to FIG. 1, a microelectronic circuit wafer is shown generally at 1 including a flip-flop circuit 3 formed thereon in a well-known manner. The circuit 3 is provided with a plurality of conductive terminals 5 each having a thickness of approximately one-quarter micron. Each of the terminals 5 terminates in a land 7 of substantially greater thickness. By way of example, each of the lands 7 may normally be ten to twenty microns thick.

Figure 2:
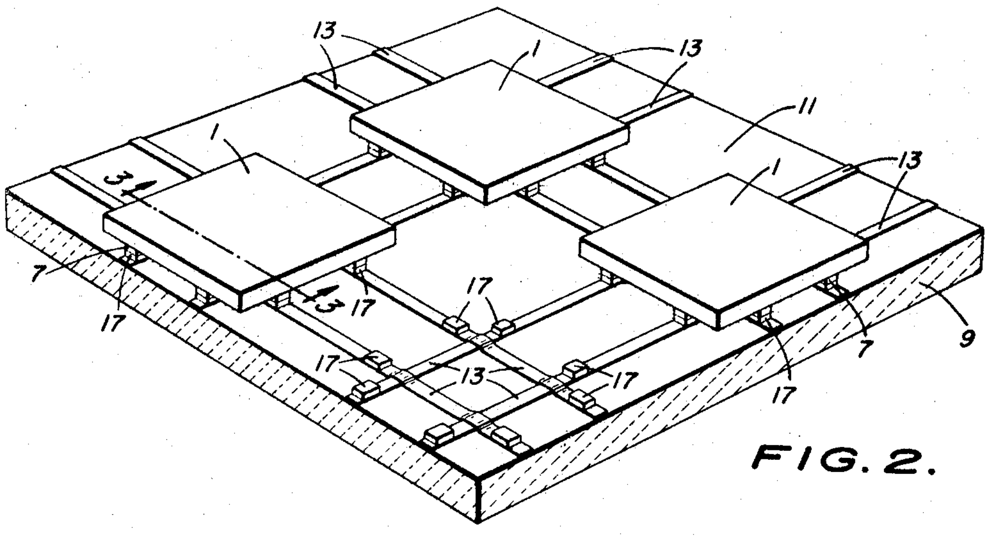
FIG. 2 is a perspective of a plurality of microelectronic circuit wafers positioned on a system substrate.

Referring again to FIG. 2, a system substrate is shown at 9 having at least one flat surface 11. The substrate 9 is generally rectangular in shape and is constructed of an insulating material which may commonly comprise glass or ceramic. A grid comprising a plurality of metallic conductors 13 is deposited upon the surface 11 of the system substrate 9. These metallic conductors 13 may normally be one-quarter micron thick.

Figure 3:
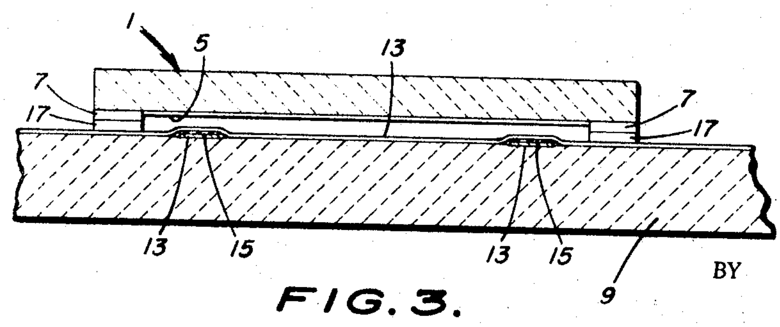
FIG. 3 is a cross-section taken along line 3—3 of FIG. 2, of a microelectronic circuit wafer positioned on a system substrate.

As best seen in FIG. 3, where the metallic conductors 13 cross, they may be insulated from each other by depositing an insulator 15 between them in a well-known manner. It is to be emphasized that, with the exception of their crossing points, all the metallic conductors 13 lie in the same plane. A plurality of lands 17 are deposited on the metallic conductors 13 in a well-known manner. By way of example, these lands 17 may normally have a thickness of from ten to twenty microns. It should be emphasized at this point that the lands 17 will be formed on the conductors 13 in such a manner that they may be registered with corresponding lands 7 on the microelectronic circuit wafers 1.

The system is assembled by inverting the circuit wafers 1 and placing them on the system substrate 9 at preassigned locations so that the lands 7 are superposed on corresponding lands 17. It should be emphasized that the lands 7 and the lands 17 are formed of conductive metallic material and that in order to form a conductive bond it is necessary to force the contacting lands 7 and 17 to coalesce. This coalescence may be accomplished by applying a thin film of conductive cement to each of the corresponding lands 7 and 17 and setting the cement by applying an appropriate degree of pressure and heat in a well-known manner. Alternately, the corresponding lands 7 and 17 may be surfaced with a metallic film, such as of gold which diffuses easily; pressure and heat may then be applied for a predetermined time interval and in a well-known manner to foster diffusion.

The diffusion of the corresponding lands 7 and 17 into each other will not only form a highly-conductive bond but it will also serve to hold the circuit wafers 1 in place. In this manner a plurality of microelectronic circuit wafers 1 can be assembled on a system substrate 9. Additionally, it should be noted that preselected ones of the lands 17, lying near the periphery of the substrate 9, may serve as input and output terminals for the system. The entire system comprising the substrate 9 and a plurality of said circuit wafers 1 may be packaged by well-known techniques such as sealing in a hermetic container or potting.

It can readily be seen that many variations and modifications of the present invention are possible in the light of the aforementioned teachings and it will be apparent to those skilled in the art that various changes in form and arrangement of components may be made without departing from the spirit and scope of the invention.

It is therefore to be understood that within the scope of the appended claims the invention may be practised in a manner otherwise than specifically described herein.

What is claimed is:

1. The combination with a plurality of microelectronic circuit wafers, each having a plurality of terminals, and an electrical interconnection grid, including a plurality of lands each connected to one of said terminals, a substrate comprising insulating material of rectangular shape and having at least one flat surface, the flat surface of said substrate being connected to said grid for supporting said grid and said plurality of microelectronic circuit wafers, a plurality of lands disposed on said grid with one of said last-mentioned lands in registration with each of said first-mentioned lands and conductively bonded thereto, said interconnection grid including a plurality of spaced metallic conductors extending between two parallel edges of said rectangular substrate and a plurality of spaced metallic conductors extending between a different two parallel edges of said substrate, wherein said last-mentioned metallic conductors may cross said first-mentioned metallic conductors, and wherein all of said spaced metallic conductors lie, for substantially their entire lengths, in the same plane, and insulating means disposed between said first-mentioned spaced metallic conductors and said last-mentioned spaced metallic conductors at their crossover points.

2. The invention of claim 1 wherein all of said lands are substantially greater in thickness than either said terminals or said spaced metallic conductors, whereby the only electrical contact between each of said microelectronic circuit wafers and said electrical interconnection grid will occur through said lands.

3. A microelectronic circuit wafer interconnection system comprising an insulating substrate having at least one flat surface, a grid of electrical conductors disposed on said flat surface and including a first plurality of parallel conductors and a second plurality of parallel conductors intersecting said first plurality of parallel conductors, said first and second pluralities of parallel conductors lying in substantially the same plane, a plurality of circuit wafers, each having a plurality of conductive terminals, a plurality of conductive lands disposed on said conductive terminals, and a plurality of conductive lands disposed on said first and second parallel conductors and capable of being registered with respect to said lands on said microelectronic circuit wafers, whereby said microelectronic circuit wafers may be electrically interconnected.

4. The invention as recited in claim 3 additionally including means for insulating said first plurality of parallel conductors from said second plurality of parallel intersecting conductors.

References Cited

UNITED STATES PATENTS

| | | | |
|---|---|---|---|
| 3,292,240 | 12/1966 | McNutt et al. | 29—577 |
| 3,316,458 | 4/1967 | Jenny | 317—101 |
| 3,368,116 | 2/1968 | Spaude | 317—101 |
| 3,373,481 | 3/1968 | Lins et al. | 29—471.3 |

LEWIS H. MYERS, *Primary Examiner.*

J. R. SCOTT, *Assistant Examiner.*

U.S. Cl. X.R.

174—68.5